United States Patent
Chen et al.

(10) Patent No.: US 7,503,996 B2
(45) Date of Patent: Mar. 17, 2009

(54) MULTIPLE FREQUENCY PLASMA CHAMBER, SWITCHABLE RF SYSTEM, AND PROCESSES USING SAME

(75) Inventors: Jinyuan Chen, Shanghai (CN); Gerald Yin, Shanghai (CN); Xueyu Qian, Shanghai (CN); Tuqiang Ni, Shanghai (CN); Hiroshi Iizuka, Shanghai (CN)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 0 days.

(21) Appl. No.: 11/739,785

(22) Filed: Apr. 25, 2007

(65) Prior Publication Data
US 2008/0251207 A1    Oct. 16, 2008

(30) Foreign Application Priority Data
Apr. 13, 2007   (CN)   ............ 2007 1 0039453

(51) Int. Cl.
C23F 1/02    (2006.01)
(52) U.S. Cl. .................. 156/345.44; 156/345.48; 156/345.47; 118/723 I; 118/723 VE
(58) Field of Classification Search ............... 156/345, 156/345.44, 345.48, 345.47; 118/723, 723 I, 118/723 VE; 315/111, 111.71, 111.01
See application file for complete search history.

(56) References Cited
U.S. PATENT DOCUMENTS
5,649,308 A  *  7/1997  Andrews ................. 370/334
* cited by examiner Primary Examiner—Tuyet Vo
(74) Attorney, Agent, or Firm—Nixon Peabody LLP; Joseph Bach, Esq.

(57) ABSTRACT

An RF power supplier is provided, that enables multiple-frequency RF power. The system uses N RF signal generators, combines the RF signals, amplify the combined signals, and then separates the amplified signal. The output of the system is then a multiple-frequency RF power. Optionally, the frequencies are switchable, so that one may select which frequencies the system outputs.

21 Claims, 9 Drawing Sheets

MULTIPLE FREQUENCY PLASMA CHAMBER, SWITCHABLE RF SYSTEM, AND PROCESSES USING SAME

BACKGROUND

1. Field of the Invention

The subject invention relates to RF power suppliers used in plasma chambers and, more specifically, RF power suppliers enabling application of multiple-frequency RF power.

2. Related Art

Plasma chambers utilizing dual RF frequencies are known in the art. Generally, a plasma chamber of dual frequencies receive RF bias power having frequency below about 15 MHz, and an RF source power at higher frequency, normally 40-200 MHz. In this context, RF bias refers to the RF power which is used to control the ion energy and ion energy distribution. On the other hand, RF source refers to RF power which is used to control the plasma ion dissociation or plasma density. For some specific examples, it has been known to operate etch plasma chambers at, e.g., bias of 2 MHz or 13 MHz, and source at 27 MHz, 60 MHz, 100 MHz, and higher.

Recently it has been proposed to operate a plasma chamber at one bias frequency and two source frequencies. For example, it has been proposed to operate a plasma etch chamber at bias frequency of 2 MHz and two source frequencies of 27 MHz and 60 MHz. In this manner, the dissociation of various ion species can be controlled using the two source RF frequencies. Regardless of the configurations, in the prior art each frequency is provided by an individual RF power supplier. For further information, the reader is directed to U.S. Pat. Nos. 6,281,469 and 7,144,521, and to U.S. Publication 2005/0264218.

SUMMARY

The following summary of the invention is provided in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various aspects of the subject invention provide plasma chambers having a single frequency source RF power and dual frequency RF bias power. Using the inventive system the bombardment energy and energy distribution of the ions can be controlled using two different frequencies. For example, when high bombardment energy is needed the chamber may be operated using the 2 MHz RF bias, while when softer ion bombardment is needed, the chamber can be operated using 13 MHz RF bias power. Of course, the chamber may also be operated using both RF bias turned on to equal or different power levels.

According to other aspects of the invention, an RF power supplier is provided, that enables switchable multiple-frequency RF power. The system uses N RF signal generators, combines the RF signals, amplify the combined signals, and then separates the amplified signal. The output of the system is then a multiple-frequency RF power. The frequencies are switchable, so that one may select which frequencies the system outputs.

According to an aspect of the invention, an RF power supply system is proposed, comprising: an RF source outputting N RF signals at N frequencies, wherein N is an integer greater than 1; an RF power combiner combining the N RF signals to output a combined RF signal; a wide-band amplifier amplifying the combined RF signal to provide an amplified RF signal; and, an RF power separator receiving the amplified RF signal and providing N amplified RF power signals at N frequencies. The RF power supply may further comprise a matching circuitry receiving the N amplified RF power signals and applying the N amplified RF power signals to a plasma chamber. The RF source may comprise at least one oscillator. The RF source may comprise at least one frequency synthesizer. The source may further comprise at least one frequency multiplier or one frequency divider. The RF power supply may further comprise a switch selectably coupling one of two predetermined frequencies of the N frequencies to the matching circuitry. The matching circuitry may comprise a plurality of matching networks, each configured to receive one of the N frequencies. The RF power supply may have N=2 and the matching circuitry may comprise a matching network configured to switchably receive one of the two frequencies. The RF power supply system may further comprise a shunt capacitor coupled to the input side of the switch.

According to another aspect of the invention, an RF power supply system is provided, comprising: a first RF source outputting first RF signal at a first frequency; a second RF source outputting second RF signal at a second frequency; an RF power combiner combining the first and second RF signals to output a combined RF signal; a wide-band amplifier amplifying the combined RF signal to provide an amplified signal; an RF power separator receiving the amplified signal and providing a first amplified RF power and a second amplified RF power; and a matching circuitry configured for receiving the first and second amplified RF powers. The matching circuitry may comprise a first match network receiving the first amplified RF power and a second match network receiving the second amplified RF power. The RF power separator may comprise at least one filter. The RF power separator may comprise a low pass filter and a band pass filter. The first RF source may comprise a frequency synthesizer. The second RF source may comprise a frequency multiplier or divider. The RF source may further comprise a controller energizing the first RF source and second RF source. The RF power supply may further comprise a switch coupled to the RF power separator, the switch having an input receiving the amplified signal and a shunt capacitor coupled to the input.

According to yet another aspect of the invention, a plasma chamber is provided, comprising: a vacuum chamber for generating plasma therein; an RF power supplier providing RF power at frequency f1; an RF source outputting N RF signals at N frequencies, wherein N is an integer greater than 1; an RF power combiner combining the N RF signals to output a combined RF signal; a wide-band amplifier amplifying the combined RF signal to provide an amplified RF signal; an RF power separator receiving the amplified RF signal and providing N amplified RF power signals at N frequencies; and a matching circuitry coupling the RF power at frequency f1 and at least one of the N frequencies to the vacuum chamber. In the plasma chamber f1 may be selected from 27 MHz, 60 MHz, 100 MHz, and about 160 MHz. The plasma chamber may have N=2, whereby the N frequencies are two frequencies selected from about 2 MHz and about 13 MHz, about 2 MHz and about 27 MHz, or about 13 MHz and about 27 MHz. The plasma chamber may have N=2, and wherein the RF source is selected from a digital synthesizer or a digital synthesizer and a frequency multiplier or divider.

The plasma chamber may further comprise a switch coupled to the RF power separator, said switch having an input receiving the amplified signal and a shunt capacitor coupled to the input.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
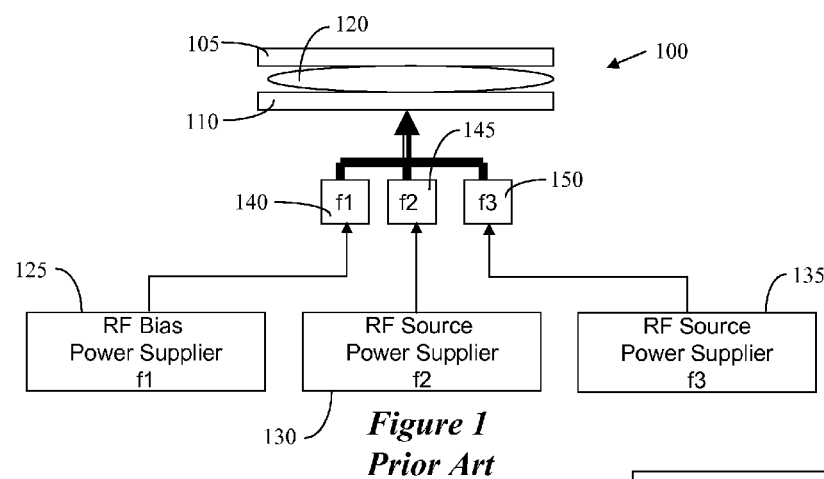
FIG. 1 is a schematic illustration of a prior art multiple frequency plasma chamber arrangement, having one bias RF power and two source RF power generators.

FIG. 1 is a schematic illustration of a prior art multiple frequency plasma chamber arrangement, having one bias RF power and two source RF power generators. More specifically, in FIG. 1 the plasma chamber 100 is schematically shown as having an upper electrode 105, lower electrode 110, and plasma 120 generated in between the two electrodes. As is known, electrode 105 is generally embedded in the chamber's ceiling, while electrode 110 is generally embedded in the lower cathode assemble upon which the work piece, such as a semiconductor wafer, is placed. As also shown in FIG. 1, a bias RF power supplier 125 provides RF power to the chamber 100 via match circuit 140. The RF bias is at frequency f1, generally 2 MHz or 13 MHz (more precisely, 13.56 MHz), and is generally applied to the lower electrode 110. FIG. 1 also shows two RF source power suppliers 130 and 135, operating at frequencies f2 and f3, respectively. For example, f2 may be set at 27 MHz, while f3 at 60 MHz. The source power suppliers 130 and 135 deliver power to chamber 100 via match networks 145 and 150, respectively. The source power may be applied to the lower electrode 110 or the top electrode 105. Notably, in all of the Figures the output of the match networks is illustrated as combined into a single arrow leading to the chamber. This is used as a symbolic representation intended to encompass any coupling of the matching networks to the plasma, whether via the lower cathode, via an electrode in the ceiling, an inductive coupling coil, etc. For example, the bias power may be coupled via the lower cathode, while the source power via an electrode in the showerhead or an inductive coil. Conversely, the bias and source power may be coupled via the lower cathode.

Figure 2:
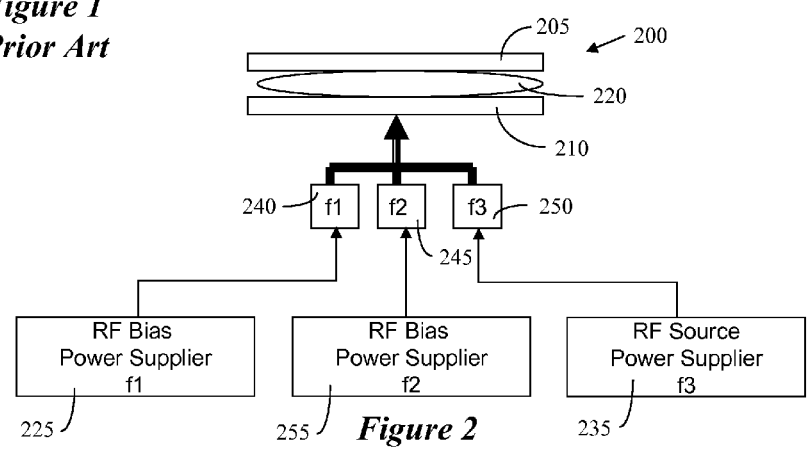
FIG. 2 is a schematic illustration of a first embodiment of the invention of a multiple frequency plasma chamber arrangement, having two bias RF power and one source RF power generators.

FIG. 2 is a schematic illustration of a first embodiment of the invention of a multiple frequency plasma chamber arrangement, having two RF bias power and one RF source power generators. In Figure, two RF bias power suppliers 225 and 255 provide RF bias power to the chamber 200 via match circuits 240 and 245, respectively. The RF bias is at frequency f1, generally 2 MHz or 2.2 MHz, while the RF bias frequency f2 is generally 13 MHz (more precisely, 13.56 MHz). Both RF bias are generally applied to the lower electrode 210. In this manner, an improved ion energy control is enabled. For example, for higher bombardment energy, such as for front-end etch applications, the 2 MHz source is used, while for softer bombardment, such as for back-end etch application, the 13 MHz bias is utilized. FIG. 2 also shows a source RF power supplier 235, operating at frequency f3, for example, 27 MHz, 60 MHz, 100 MHz, etc. The source power 235 is delivered to chamber 200 via match network 250. The source power may be applied to the lower electrode 210 or the top electrode 205. The source power is used to control the plasma density, i.e., plasma ion dissociation.

In the subject specification, a matching circuitry is used to couple the RF power to the chamber. The matching circuitry may generally comprise a plurality of matching networks, and any suitable matching network can be used. However, for improved results, it is recommended to use the matching network described in co-owned patent application Ser. No. 11/350,022, filed Feb. 8, 2006.

As noted above, in the prior art the various RF bias and source powers were generated using separate RF power suppliers. However, amplification of RF power is relatively expensive and the multiplicity of RF power suppliers leads to high costs and lower reliability. Accordingly, according to various aspects of the invention, the generation of multiple RF power is achieved in an improved architecture that lowers the cost and improves reliability of the system.

According to an aspect of the invention, several RF signal generators, such as crystal oscillators or frequency synthesizers, are provided. The signal from the RF signal generators is combined and is then amplified using wide-band amplifier, using e.g., FET amplifier. The amplified signal is then separated and provided to the appropriate RF match network. A controller determines which frequency signal generator is energized, so that one may select which frequency the system outputs. This saves on the number of amplifiers, so that in essence the system uses a single RF power generator to provide switchable, multiple-frequency RF power. Additionally, the conventional RF amplifier requires high quality DC power supply to operate properly. By using only one RF amplifier the expense associated with providing multiple DC power suppliers are avoided.

Figure 3:
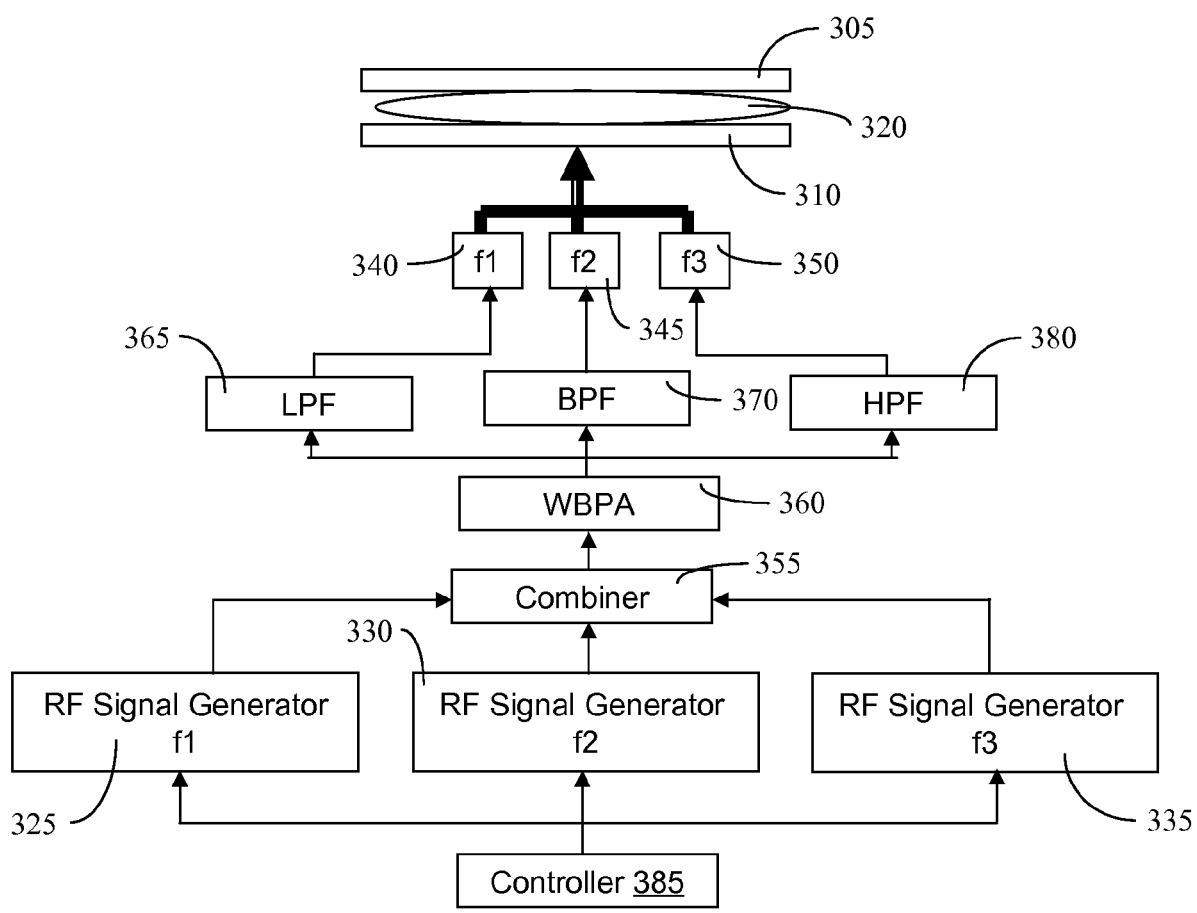
FIG. 3 depicts an embodiment of a single RF power source providing—multiple-frequency RF power.

FIG. 3 depicts an embodiment of a single RF power source providing multiple-frequency RF power. In FIG. 3, RF signal generators 325, 330 and 335 provide RF signal at frequencies f1, f2, and f3, respectively. The RF signal generators may be, e.g., oscillators (e.g. crystal oscillators), frequency synthesizers, such as direct digital frequency synthesizers (DDS), phase locked loop frequency synthesizers (PLL synthesizers), etc. In one example, f1 is set to 2 MHz, f2 is set to 13 MHz, and f3 is set to 60 MHz. The output of the three signal generators 325, 330 and 335 is then combined by combiner 355 (sometimes referred to as diplexer) and is sent to wideband power amplifier WBPA 360. The WBPA 360 amplifies the combined RF signal and outputs a combined amplified RF signal of the three frequencies f1, f2, and f3. The combined amplified RF signal is then filtered using a low-pass filter 365, band-pass filter 370, and high pass filter 380, and the output of the filters, i.e., f1, f2, and f3, is applied to match networks 340, 345, and 350, respectively. In this manner, a single amplifier has been used, but the system provides three RF power signals. In usage, a controller 385 is used to control activation of the RF signal generators.

As can be understood, according to one embodiment RF signal generators 325 and 330 are used to provide RF bias power, while signal generator 335 is used to provide RF source power. In such a configuration, the controller 385 would energize the RF signal generator 335 to the appropriate power required to generate the desired ion dissociation. The controller 385 would also energize either or both RF signal generators 325 and 330 to obtain the desired ion bombardment energy. For example, for high bombardment energy the controller 385 may energize only RF signal generator 325, while for low ion bombardment energy the controller 385 may energize only RF signal generator 330.

On the other hand, this configuration may also be used to provide power to systems using two RF source power. In such a configuration, the RF signal generator 325 may be set to, e.g., 2 MHz or 13 MHz to provide bias power, while RF signal generator 330 may be set to, e.g., 27 MHz and RF signal generator 335 may be set to 60 MHz, thereby providing two frequency source power to control the plasma density. Under such configuration the controller 385 would energize the RF signal generator 325 to provide the bias power, and the RF signal generators 330 and 335 to provide the source power.

Figure 4A:
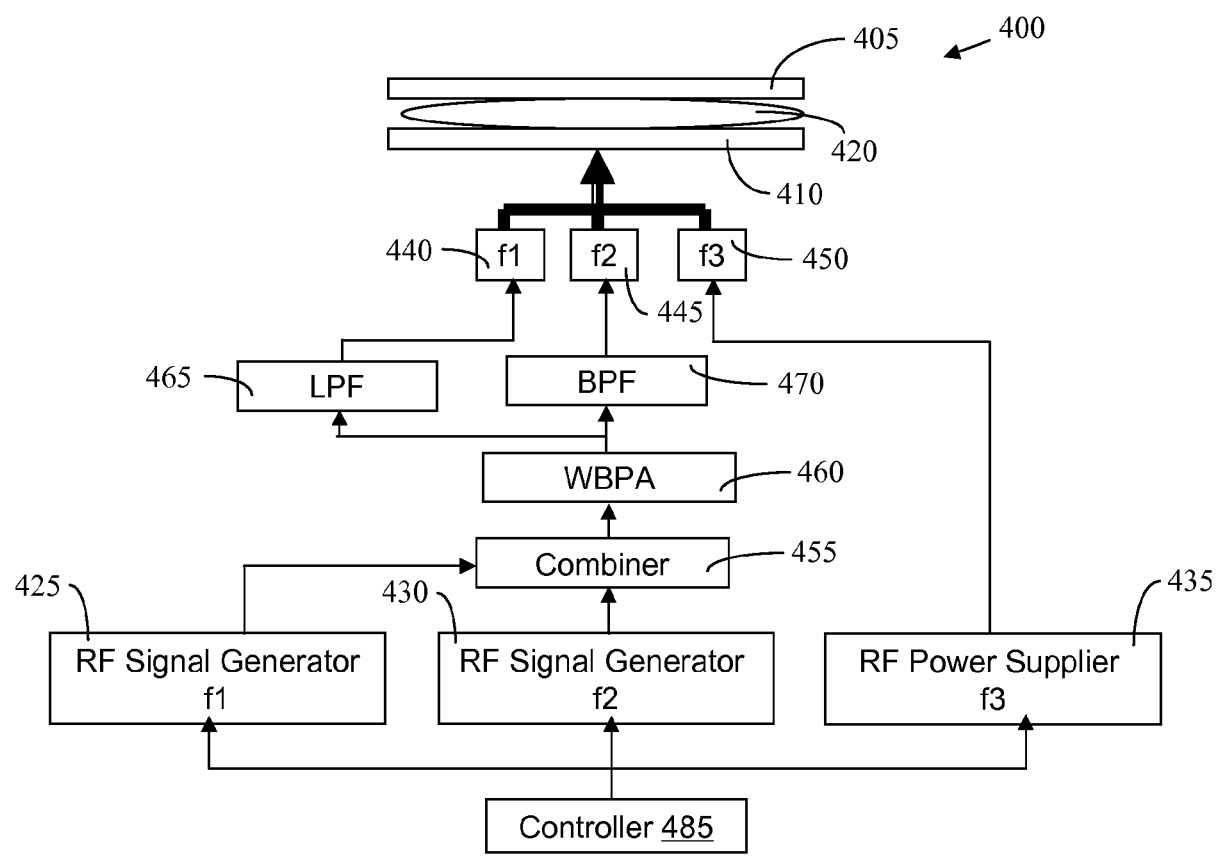
FIGS. 4A and 4B depict embodiments of the invention providing a combined dual frequency RF system and separate high frequency supply.

FIG. 4A depicts an embodiment of the invention providing a combined dual frequency RF system and separate high frequency power supply. In FIG. 4A, frequency f3 is provided conventionally using a conventional RF power supplier 435 coupled to conventional match network 450. However, frequencies f1 and f2 are provided using an embodiment of the invention by having the output of RF signal generators 425 and 430 combined by combiner 455, amplified by wide-band power amplifier 460, and then separated using low-pass filter 465 and band-pass filter 470. The amplified RF signal is then input to the match networks 440 and 445.

The embodiment of FIG. 4A can be used to improve on the multiple frequency chamber of the prior art using single bias and dual source frequencies. In such an arrangement, the frequency f3 of RF power supplier 435 is set to the bias frequency, say 2 MHz. The source frequencies are provided by the RF signal generators 425 and 430, by setting frequencies f1 and f2 to, for example, 27 MHz and 60 MHz.

Conversely, the arrangement of FIG. 4A can be used to operate a chamber according to the subject invention, wherein two bias frequencies are used with a single source frequency. In such a configuration, frequency f3 of RF power supplier 435 is set to the source frequency, say 60 MHz. On the other hand, frequencies f1 and f2 are set to the bias frequencies, say 2 MHz and 13 MHz. As in the embodiment of FIG. 3, the controller 485 controls the operation of RF signal generators 425 and 430 and the operation of RF power supplier 435.

Figure 4B:
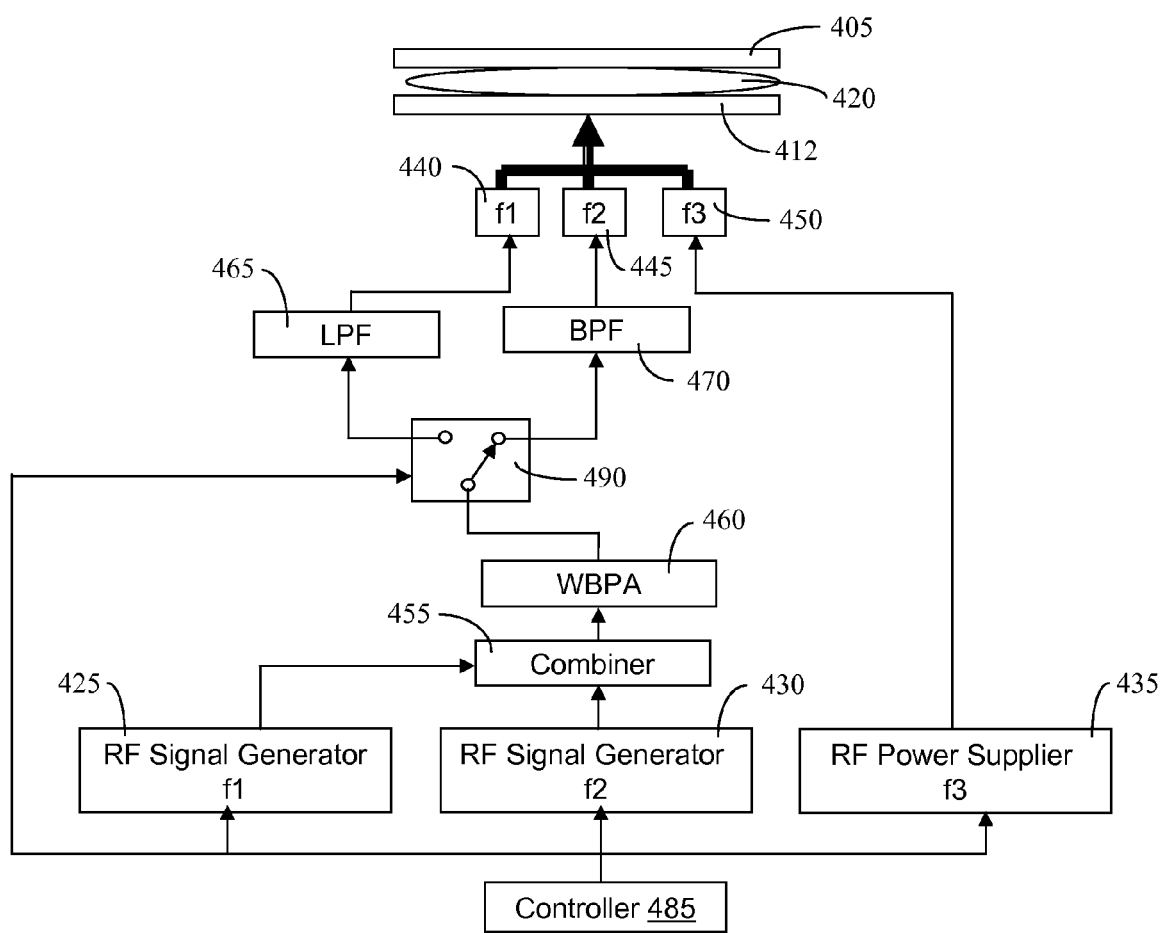

FIG. 4B depicts a variation of the embodiment of FIG. 4A. Notably, the configuration of FIG. 4B is similar to that of FIG. 4A, except that a switch 490 is provided for switching between frequencies f1 and f2. The switch 490 may be, e.g. an RF power vacuum relay or a PIN diode. Using this configuration, the two frequencies are generated using common AC/DC power suppliers, common RF power amplifier, and common communication system, so that cost is reduced.

Figure 5:
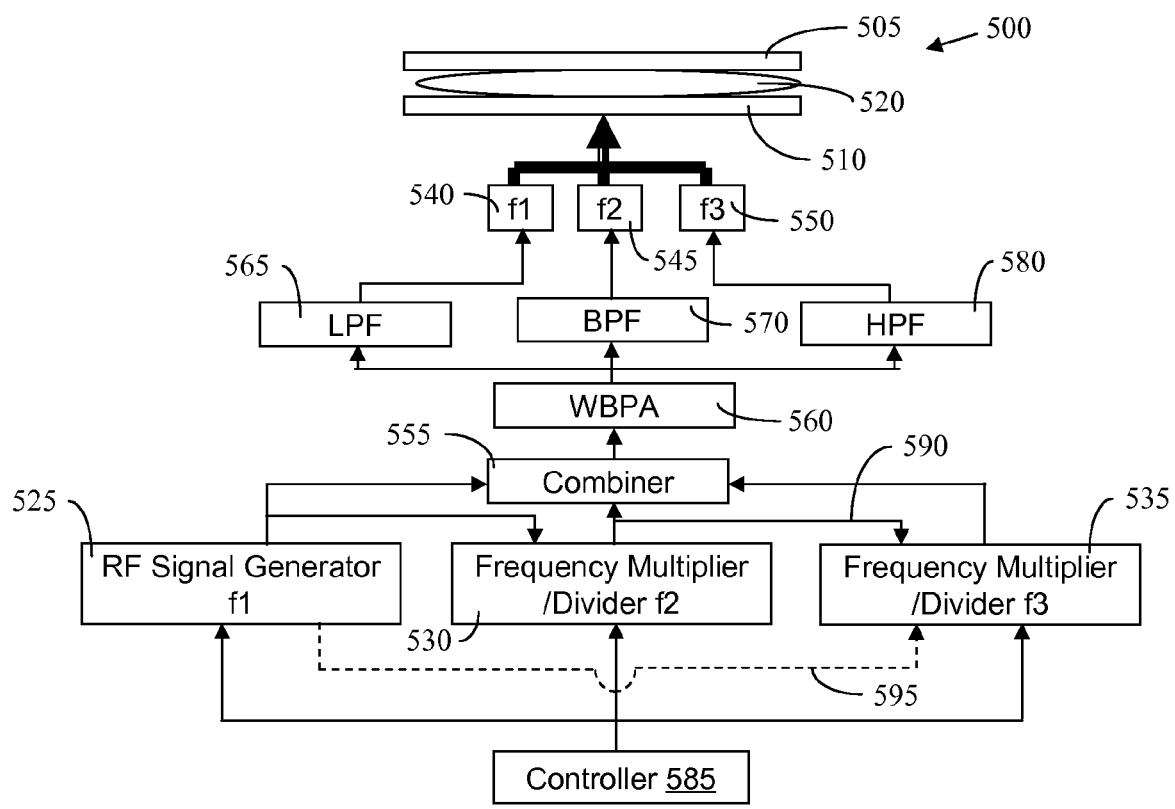
FIG. 5 depicts an embodiment that uses a single RF signal generator to provide multiple frequencies.

FIG. 5 depicts an embodiment that uses a single RF signal generator to provide multiple frequencies. In FIG. 5, the RF signal generator 525 provides an RF signal at frequency f1. RF signal generator 525 may be similar to the RF signal generators shown in FIGS. 2-4, such as, e.g., a crystal oscillator, a frequency synthesizer, etc. The signal of the RF signal generator 525 is split; part of it is supplied to the combiner 555, while the other part is applied to frequency multiplier or divider 530. As is known, RF frequency multipliers or dividers are devices that produce an output signal with a frequency that is larger or smaller than the frequency of a corresponding input signal by a predetermined factor. The output of the frequency multiplier or divider 530 is at frequency f2; part of it being input to the combiner 555, while the other part is input to the second frequency multiplier or divider 535. In this embodiment the output of the second frequency multiplier or divider 535 is also input to the combiner 555. The output of the combiner 555 is amplified and filtered as shown in the embodiment of FIG. 3.

As can be understood, the embodiment of FIG. 5 may be used to improve the prior art multiple source power system, or to run the inventive multiple bias system. For example, when running the system in a multiple source power configuration, the signal generator 525 can be set to provide a signal at 2 MHz, the first frequency multiplier or divider can be set at 13×, to provide a first source output at 26 MHz, and the second frequency multiplier or divider can be set at 2×, to provide a second source output at 52 MHz. On the other hand, when the system is used with a dual bias power plasma chamber, the signal generator 525 can be set to provide a signal at 2.2 MHz, the first frequency multiplier or divider can be set at 6×, to provide a second bias output at 13 MHz, and the second frequency multiplier or divider can be set at 5×, to provide a source output at 66 MHz.

In the cascading configuration illustrated in FIG. 5, the RF frequency multiplier or divider 535 cannot operate unless multiplier 530 is also operational. In order to achieve a more flexible control, the system may be configured as shown by the broken line 595 of FIG. 5. In this case, frequency multiplier or divider 535 may either multiply the signal of frequency f2 received from frequency multiplier or divider 530 or the signal of frequency f1 received from the RF signal generator 525. In this manner, while RF frequency generator 525 must be on during operation, either or both frequency multipliers or dividers 530 and 535 may be on or off. For example, assuming that the RF signal generator is operated at frequency of 2.2 MHz, the frequency multiplier or divider 530 is set to 6×, and the frequency multiplier or divider 535 is set at 15×. Then, when the input to the frequency multiplier or divider 535 is provided via line 590, the output f3 is 165 MHz, while when the input to the frequency multiplier or divider 535 is provided via line 595, the output f3 is 33 MHz. Consequently, such configuration enables a plasma chambers having dual frequency bias power and dual frequency source power. Of course, if there is no requirement for four frequencies, then line 590 may be eliminated to provide three frequencies.

Figure 6:
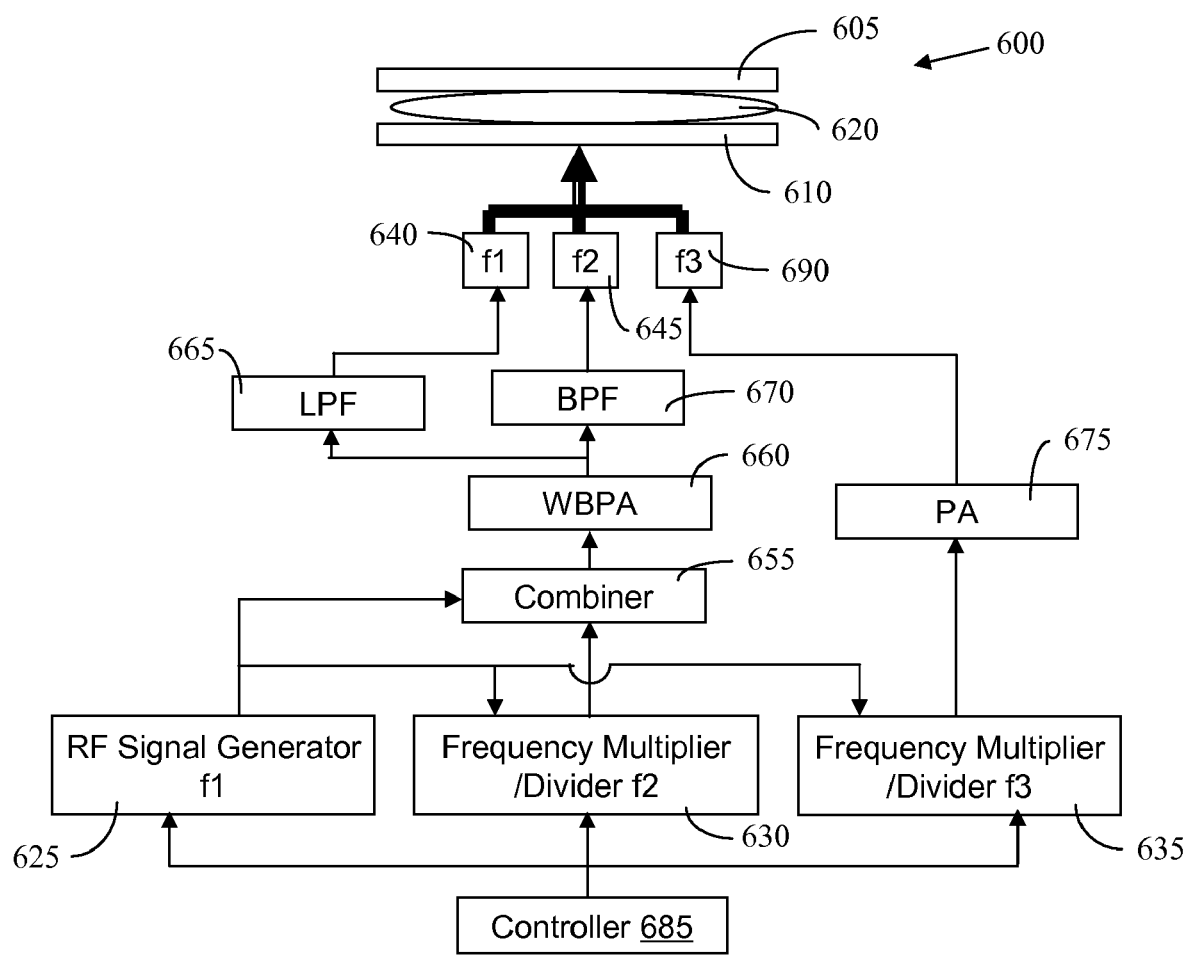
FIG. 6 provides yet another embodiment of a multiple frequency system according to the invention.

FIG. 6 provides yet another embodiment of a multiple frequency system according to the invention. In FIG. 6, a single RF signal generator 625 provide a signal at frequency f1. The signal is applied to frequency multiplier or divider 630 and to frequency multiplier or divider 635. The signal from frequency multiplier or divider 635 is amplified by power amplifier 675 and applied to the plasma chamber via matching network 640. On the other hand, the output of the RF signal generator 625 and the frequency multiplier or divider 630 are combined in combiner 655, amplified by wide-band amplifier 660, separated by low-pass filter 665 and band-pass filter 670, and applied to the plasma chamber via matching networks 640 and 645. In this manner, frequency f2 may or may not be applied to the plasma chamber 600 irrespective of the application of frequencies f1 and f3.

Figure 7:
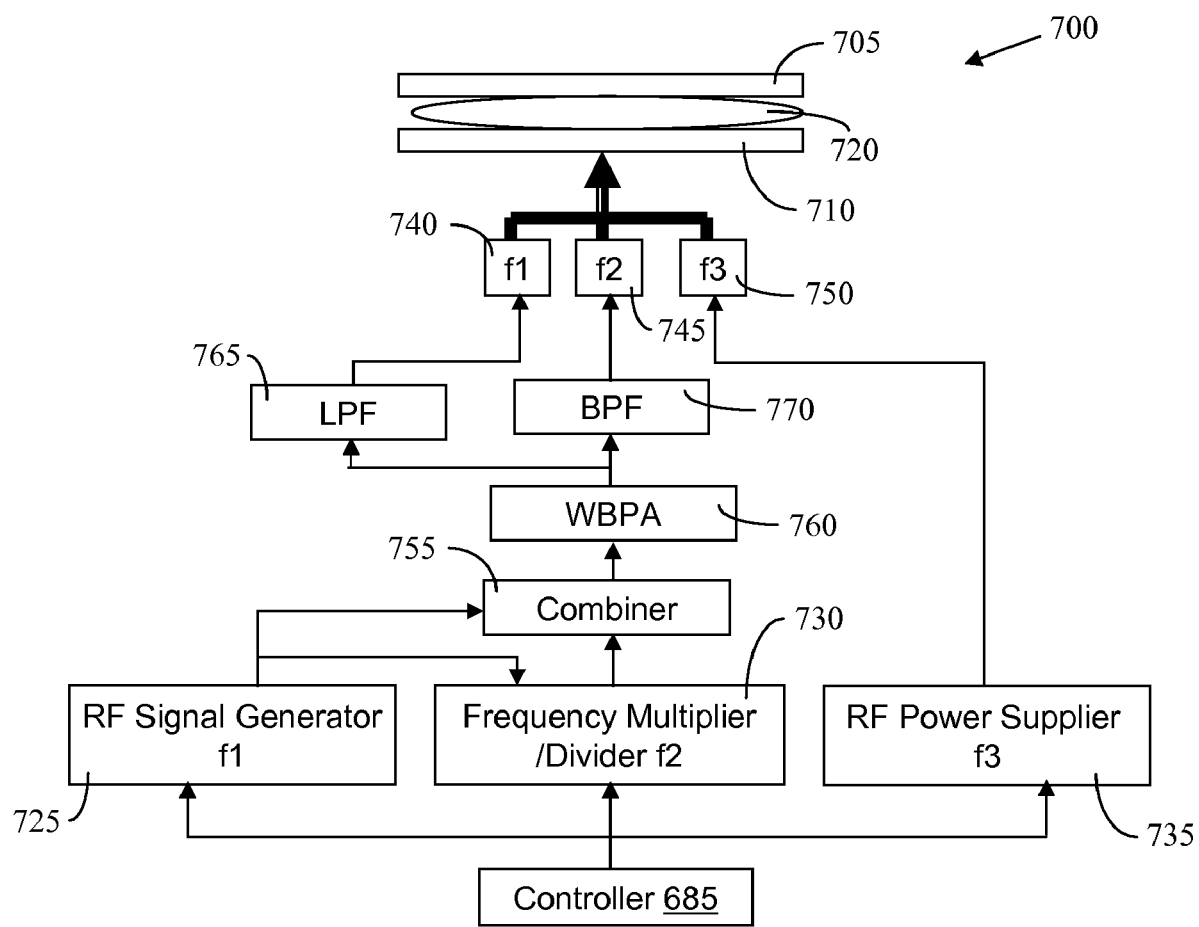
FIG. 7 provides another embodiment of a multiple frequency system according to the invention.

FIG. 7 provides another embodiment of a multiple frequency system according to the invention. In the embodiment of FIG. 7, an RF signal generator 725 provides a signal at frequency f1, which is provided to combiner 755 and to frequency multiplier or divider 730. The signal of frequency multiplier or divider 730 is also provided to combiner 755. The combined signal is amplified by wide-band amplifier 760 and the amplified signal is separated by low-pass filter 765 and band-pass filter 770 to be applied to chamber 700 via matching networks 740 and 745. On the other hand, a third frequency, f3, is provided using a separate RF power supplier 735, which may be a conventional RF power supplier.

Figure 8:
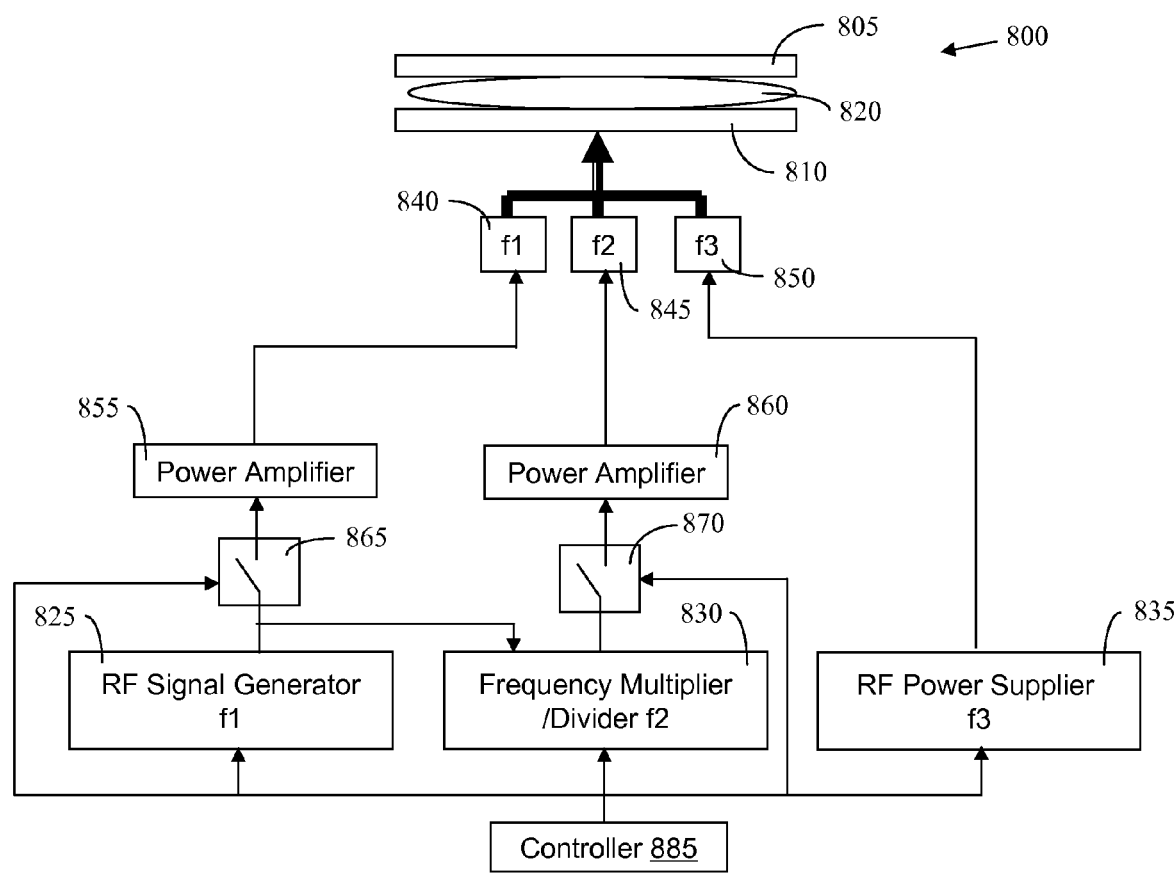
FIG. 8 provides an embodiment of a multiple frequency system not using a combiner, according to the invention.

FIG. 8 provides an embodiment of a multiple frequency system not using a combiner, according to the invention. In FIG. 8, RF signal generator 825 provides an RF signal at frequency f1. The signal is provided to power amplifier 855 via switch 865, and to frequency multiplier or divider 830. The output amplified signal from power amplifier 855 is coupled to the plasma chamber 800 via matching network 840. The frequency multiplier or divider 830 provides an RF output f2 that is a multiple of frequency f1. The amplified f2 signal is provided to amplifier 860 via switch 870, and the amplified output is coupled to chamber 800 via matching network 845. Additionally, an RF power supplier 835 provides yet another RF signal at frequency f3, which is provided to chamber 800 via matching network 850.

In this configuration, one, two, or three frequencies can be applied to chamber 800. For example, RF signal generator 825 can be set to provide RF signal at 2.2 MHz, with frequency multiplier or divider 830 set to 6×, so that f2 is 13 MHz. The RF power supplier 835 can provide signal at, e.g., 60 MHz. In this case, a dual bias architecture is provided, wherein controller 885 can energize RF power supplier 835 to provide the RF source power, and engage switch 865 for a 2.2 MHz bias power, engage switch 870 for a 13 MHz bias power, or engage both switches 865 and 870 for dual bias power at 2.2 MHz and 13 MHz. Conversely, in order to provide a dual source frequency chamber, the multiplier 830 can be set at, e.g., 12×, so that its output is a source frequency of 26.4 MHz.

Figure 9:
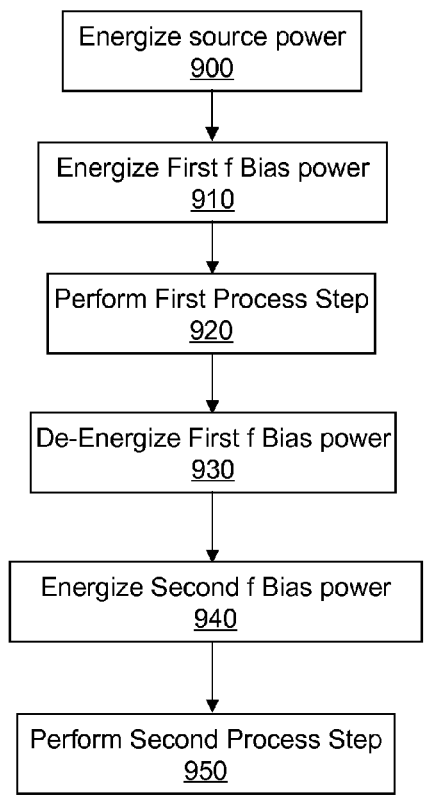
FIG. 9 provides an example for processing using two bias frequencies, according to an embodiment of the invention.

Any of the above embodiments can be used to operate a plasma chamber to provide a processing having a first period operating at a first bias frequency and a second period operating at a second bias frequency. For example, the chamber may be operated using a low bias frequency, e.g., about 2 MHz for the main etch step; however, in order to create a "soft landing" during the over etch the system may be switched to operate using a higher frequency bias, such as, e.g., about 13 MHz. FIG. 9 provides an example for processing using two bias frequencies, according to an embodiment of the invention. This process may be, for example, etching of a semiconductor wafer. In step 900 the source RF power supply is energized to strike the plasma. The source RF power may be at frequencies, e.g., 27 MHz, 60 MHz, 100 MHz, 160 MHz, etc. At step 910 the first bias frequency is energized and applied to the chamber to cause the dissociated ions to bombard the wafer during a first processing step (Step 920). When the first processing step is completed, at step 930 the first bias power is de-energized and at step 940 the second bias power is energized so as to proceed with the second processing at step 950. IN this case, the first bias frequency may be, e.g., about 2 MHZ and the second bias frequency about 13 MHz.

Figure 10:
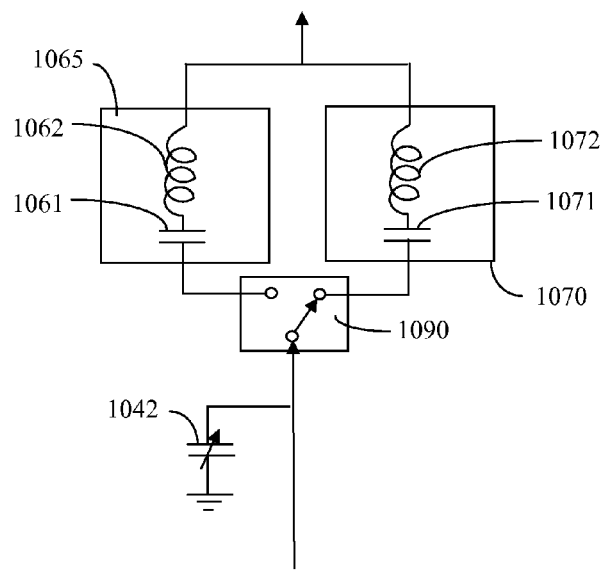
FIG. 10 illustrates an embodiment where a switch and a shunt capacitor coupled to a matching circuit are used to enable switching between two frequencies.

FIG. 10 illustrates an embodiment where a switch and a shunt capacitor coupled to a matching circuit are used to enable switching between two frequencies. This embodiment may be used, for example, in conjunction with the embodiment shown in FIG. 4B. In FIG. 10, a single shunt capacitor 1042 is coupled to the switch 1090. Each output leg of the switch is connected to a matching circuit 1065 or 1070. Circuit 1065 comprises a capacitive element 1061 and inductive element 1062, while circuit 1070 comprises a capacitive element 1071 and inductive element 1072. The output of both circuits may be coupled together for application to the cathode of the plasma reactor. This coupling is enabled by the use of the switch and shunt capacitor, which prevents loss of energy from the disconnected circuit. That is, e.g., when the switch is coupled to circuit 1070, as illustrated in FIG. 10, no energy is lost via circuit 1065, since the shunt capacitor is coupled at the leading line before the input of the switch. Consequently, all of the energy is coupled to the cathode.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described software may be implemented in a wide variety of programming or scripting languages, such as Assembler, C/C++, perl, shell, PHP, Java, etc.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the plasma chamber arts. It is intended that the specification and examples be considered as exemplary only, with a true scope and spirit of the invention being indicated by the following claims.

The invention claimed is:

1. An RF power supply system, comprising:
   an RF source outputting N RF signals at N frequencies, wherein N is an integer greater than 1;
   an RF power combiner combining the N RF signals to output a combined RF signal;
   a wide-band amplifier amplifying the combined RF signal to provide an amplified RF signal;
   an RE power separator receiving the amplified RF signal and providing N amplified RF power signals at N frequencies: and,
   a matching circuitry receiving the N amplified RE power signals and applying the N amplified RF power signals to a plasma chamber.

2. The RF power supply system of claim 1, wherein the RF source comprises at least one oscillator.

3. The RF power supply system of claim 1, wherein the matching circuitry comprises a plurality of matching networks, each configured to receive one of the N frequencies.

4. The RF power supply system of claim 1, wherein N=2 and the matching circuitry comprises a matching network configured to switchably receive one of the two frequencies.

5. The RF power supply system of claim 1, wherein the RF source comprises at least one frequency synthesizer.

6. The RF power supply system of claim 5, wherein the RF source further comprises at least one frequency multiplier or one frequency divider.

7. The RF power supply system of claim 1, further comprising a switch selectably coupling one of two predetermined frequencies of the N frequencies to the matching circuitry.

8. The RF power supply system of claim 7, further comprising a shunt capacitor coupled to the input side of the switch.

9. An RF power supply system for energizing a plasma chamber, comprising:
    a first RF source outputting first RF signal at a first frequency;
    a second RF source outputting second RF signal at a second frequency;
    an RF power combiner combining the first and second RF signals to output a combined RF signal;
    a wide-band amplifier amplifying the combined RF signal to provide an amplified signal;
    an RF power separator receiving the amplified signal and providing a first amplified RF power and a second amplified RF power;
    a matching circuitry configured for receiving the first and second amplified RF powers and applying the first and second amplified RF powers to the plasma chamber.

10. The RF power supplier of claim 9, wherein the matching circuitry comprises a first match network receiving the first amplified RF power and a second match network receiving the second amplified RF power.

11. The RF power supplier of claim 9, wherein the RF power separator comprises at least one filter.

12. The RF power supplier of claim 9, wherein the RF power separator comprises a low pass filter and a band pass filter.

13. The RF source of claim 9, further comprising a controller energizing said first RF source and second RF source.

14. The RF power supply system of claim 9, further comprising a switch coupled to the RF power separator, said switch having an input receiving the amplified signal and a shunt capacitor coupled to the input.

15. The RF source of claim 9, wherein the first RF source comprises a frequency synthesizer.

16. The RF source of claim 15, wherein the second RF source comprises a frequency multiplier or divider.

17. A plasma chamber comprising:
    a vacuum chamber for generating plasma therein;
    an RF power supplier providing RF power at frequency f1;
    an RF source outputting N RF signals at N frequencies, wherein N is an integer greater than 1;
    an RF power combiner combining the N RF signals to output a combined RF signal;
    a wide-band amplifier amplifying the combined RF signal to provide an amplified RF signal;
    an RF power separator receiving the amplified RF signal and providing N amplified RF power signals at N frequencies;
    a matching circuitry coupling the RF power at frequency f1 and at least one of the N frequencies to the vacuum chamber.

18. The plasma chamber of claim 17, wherein f1 is selected from 27 MHz, 60 MHz, 100 MHz, and about 160 MHz.

19. The plasma chamber of claim 17, wherein N=2, whereby the N frequencies are two frequencies selected from about 2 MHz and about 13 MHz, about 2 MHz and about 27 MHz, or about 13 MHz and about 27 MHz.

20. The plasma chamber of claim 17, wherein N=2, and wherein the RF source is selected from a digital synthesizer or a digital synthesizer and a frequency multiplier or divider.

21. The plasma chamber of claim 17, further comprising a switch coupled to the RF power separator, said switch having an input receiving the amplified signal and a shunt capacitor coupled to the input.

* * * * *